(12) United States Patent
Lee

(10) Patent No.: US 10,595,448 B2
(45) Date of Patent: Mar. 17, 2020

(54) DISPLAY APPARATUS AND MANUFACTURING METHOD THEREOF

(71) Applicant: LG DISPLAY CO., LTD., Seoul (KR)

(72) Inventor: SeongRim Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/250,107

(22) Filed: Jan. 17, 2019

(65) Prior Publication Data

US 2019/0150329 A1    May 16, 2019

Related U.S. Application Data

(62) Division of application No. 15/697,274, filed on Sep. 6, 2017, now Pat. No. 10,225,963.

(30) Foreign Application Priority Data

Nov. 21, 2016    (KR) .................... 10-2016-0155237

(51) Int. Cl.
| | |
|---|---|
| *H05K 7/20* | (2006.01) |
| *G02F 1/1345* | (2006.01) |
| *H01L 23/498* | (2006.01) |
| *G02F 1/1333* | (2006.01) |
| *H05K 7/14* | (2006.01) |

(Continued)

(52) U.S. Cl.
CPC ..... *H05K 7/20954* (2013.01); *G02F 1/13452* (2013.01); *G02F 1/133305* (2013.01); *H01L 23/4985* (2013.01); *H05K 7/14* (2013.01); *H05K 13/04* (2013.01); *G02F 2201/42* (2013.01); *G02F 2201/56* (2013.01); *G09G 3/20* (2013.01); *G09G 2310/0281* (2013.01); *H01L 23/49827* (2013.01)

(58) Field of Classification Search
CPC ...... H05K 7/20954; H05K 13/04; H05K 7/14; G02F 1/133305; G02F 1/13452; G02F 2201/56; G02F 2201/42; H01L 23/4985; H01L 23/49827; G09G 2310/0281; G09G 3/20
See application file for complete search history.

(56) References Cited

U.S. PATENT DOCUMENTS

2002/0125815 A1   9/2002   Wakita
2002/0140654 A1*   10/2002   Kim .................... G02F 1/13452
                                                                             345/87

(Continued)

*Primary Examiner* — Victor A Mandala
(74) *Attorney, Agent, or Firm* — Polsinelli PC

(57) ABSTRACT

The present aspects provide a display apparatus including a chip-on-film (COF), which may include: a plastic substrate configured to have at least one through-hole formed in one area thereof and a conductor inserted into the through-hole; a display part configured to be disposed in another area on an upper surface of the plastic substrate; a first pad part configured to have a plurality of pads, at least one of which is disposed in the one area on the upper surface of the plastic substrate to overlap the through-hole, and configured to be connected to one end of the conductor; and a second pad part configured to be disposed on a back surface of the plastic substrate, and configured to have a plurality of pads, at least one of which is in contact with the other end of the conductor, and further provide a method for manufacturing the same.

3 Claims, 12 Drawing Sheets

(51) Int. Cl.
*H05K 13/04* (2006.01)
*G09G 3/20* (2006.01)

(56) References Cited

U.S. PATENT DOCUMENTS

| | | | | |
|---|---|---|---|---|
| 2006/0154468 | A1* | 7/2006 | Tanaka | G02F 1/13452 |
| | | | | 438/613 |
| 2008/0232047 | A1* | 9/2008 | Yamada | G02F 1/13452 |
| | | | | 361/679.02 |
| 2010/0134712 | A1* | 6/2010 | Tang | G02F 1/13452 |
| | | | | 349/58 |
| 2011/0151626 | A1 | 6/2011 | Lin et al. | |
| 2014/0307396 | A1* | 10/2014 | Lee | H05K 1/028 |
| | | | | 361/749 |
| 2014/0355227 | A1* | 12/2014 | Lim | H05K 1/028 |
| | | | | 361/749 |
| 2015/0036300 | A1* | 2/2015 | Park | H05K 1/147 |
| | | | | 361/749 |
| 2015/0270593 | A1 | 9/2015 | Chuo et al. | |
| 2016/0147361 | A1* | 5/2016 | Ahn | G06F 3/0416 |
| | | | | 345/173 |
| 2016/0183374 | A1 | 6/2016 | Prakash et al. | |
| 2016/0363795 | A1* | 12/2016 | Jeon | G02F 1/1339 |
| 2017/0108732 | A1* | 4/2017 | Oh | G02F 1/13452 |
| 2017/0162821 | A1* | 6/2017 | Oh | H01L 27/323 |
| 2017/0309644 | A1* | 10/2017 | Yeh | H01L 27/124 |
| 2018/0007791 | A1 | 1/2018 | Prakash et al. | |
| 2018/0286316 | A1* | 10/2018 | Yuki | G02F 1/133308 |

* cited by examiner

DISPLAY APPARATUS AND MANUFACTURING METHOD THEREOF

CROSS REFERENCE TO RELATED APPLICATION

This application is a divisional application of U.S. patent application Ser. No. 15/697,274 filed on Sep. 6, 2017, now allowed, which claims priority from Korean Patent Application No. 10-2016-0155237, filed on Nov. 21, 2016, which are hereby incorporated by reference in their entireties for all purposes as if fully set forth herein.

BACKGROUND

Field of the Disclosure

The present disclosure relates to a display device, and more particularly, to a display apparatus and a method for manufacturing the same. Although the present disclosure is suitable for a wide scope of application, it is particularly suitable for narrowing a bezel area of the display apparatus and the method for manufacturing the same.

Description of the Background

With the development of the information society, demand is growing for display devices in a variety of types for displaying images. Recently, various display devices, such as a liquid crystal display (LCD), a plasma display panel (PDP), and an organic light-emitting diode display (OLED), have been utilized.

In general, display devices adopt display panels having a rectangular shape. However, the recent development of wearable devices, such as a smart watch and smart glasses, has required display devices with various shapes.

It is a recent trend to narrow a bezel portion of a display panel in order to enhance the aesthetics of the display panel. The narrowing of the bezel portion should be applied to display panels adopted in wearable devices, and a method for narrowing the bezel portion is required in the case where the display panels have various shapes.

SUMMARY

Accordingly, the present disclosure is directed to a display apparatus and a method for manufacturing the same that substantially obviate one or more of problems due to limitations and disadvantages of the prior art.

Additional features and advantages of the disclosure will be set forth in the description which follows and in part will be apparent from the description, or may be learned by practice of the invention. Other advantages of the present disclosure will be realized and attained by the structure particularly pointed out in the written description and claims hereof as well as the appended drawings.

More specifically, the present disclosure is to provide a display apparatus capable of narrowing a bezel portion.

In addition, the present disclosure is to provide a method for manufacturing a display apparatus, which is able to simplify processes and to reduce a manufacturing cost.

According to an aspect, the present disclosure provides a display apparatus including a chip-on-film (COF), which may comprise: a plastic substrate configured to have at least one through-hole formed in one area thereof and a conductor inserted into the through-hole; a display part configured to be disposed in another area on an upper surface of the plastic substrate; a first pad part, configured to have a plurality of pads, at least one of which is disposed in one area on the upper surface of the plastic substrate to overlap the through-hole, and configured to be connected to one end of the conductor; and a second pad part, configured to be disposed on a back surface of the plastic substrate, and configured to have a plurality of pads, at least one of which is in contact with the other end of the conductor.

According to another aspect, the present disclosure provides a method for manufacturing a display apparatus, which comprises: forming a through-hole in at least one pad of a first pad part, including a plurality of pads, which is formed in one area of a plastic substrate; inserting a conductor into the through-hole such that one end of the conductor is connected to the pad and the other end of the conductor is exposed on a back surface of the plastic substrate; and connecting at least one pad of a chip-on-film (COF) having a second pad part including a plurality of pads to the other end of the conductor.

According to a further aspect, the present disclosure provides a display apparatus includes first and second substrates, the second substrate including first, second and third parts and longer than the first substrate; a display part where a data line and a gate line intersects each other, including a plurality of pixels and disposed on the second substrate; a first pad part having a plurality of pads, at least one of the plurality of pads connected to the third part of the second substrate; and a chip-on-film electrically connected to the third part of the second substrate through the first pad part.

According to the present disclosure, it is possible to provide a display device capable of narrowing the width of a bezel portion.

Further, according to the present disclosure, it is possible to provide a method of manufacturing a display device, which is able to simplify processes and is able to reduce a manufacturing cost.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
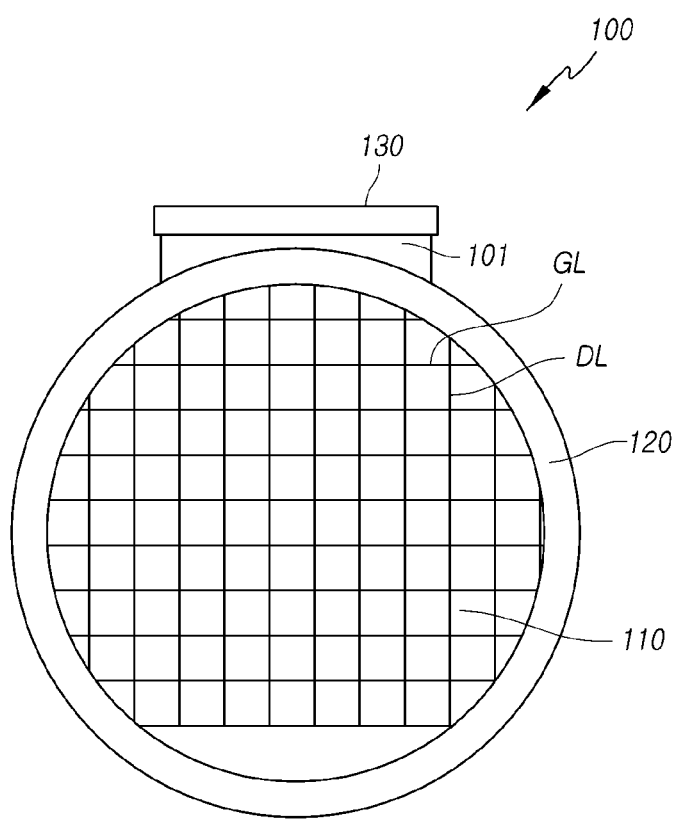
FIG. 1 is a plan view showing an aspect of a display apparatus according to the present disclosure.

Hereinafter, aspects of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a plan view showing an aspect of a display apparatus according to the present disclosure.

Referring to FIG. 1, the display apparatus 100 may include a display part 110 having a circular shape and a substrate 101 that is formed such that a first pad part 130 corresponding to the display part 110 rests thereon. The display part 110 disposed on the substrate 101 may include a plurality of pixels. The display part 110 may include a plurality of pixels (not shown) formed in areas where gate lines (GL) and data lines (DL) intersect each other. In addition, a data wire (not shown) for applying a data signal to the data line (DL), a gate-in-panel (GIP) circuit (not shown) for applying a gate signal to the gate line (GL), a gate control signal wire (not shown) for applying a gate control signal to the GIP circuit, and a common power supply line (not shown) for applying common power to the pixels may be disposed in the edge 120 of the display part 110.

In addition, an area where images are displayed in the display part 110 may be referred to as an active area, and an area where images are not displayed in the display part 110 may be referred to as an inactive area. The inactive area may correspond to the edge 120 of the display part 110, and may be the pixels located at the edge 120, among the pixels of the display part 110; a portion where the data wire, the gate-in-panel (GIP) circuit, the gate control signal wire, the common power supply line, and the like for applying signals to the pixels are disposed; and a portion where the first pad part 130 is disposed. However, the present disclosure is not limited thereto. Further, the inactive area may be covered by the bezel.

The first pad part 130 may be connected to the data wire, the gate control signal wire, the common power supply line, and the like on the substrate 101. In addition, the first pad part 130 may be connected to an external device (not shown) to allow the display part 110 to communicate with the external device. The first pad part 130 may be configured to transmit a lighting signal received from the external device to the display part 110 in order to perform lighting inspection during the manufacturing process. In addition, the external device may be a drive IC (not shown) disposed in a chip-on-film (COF), and may receive a data signal through the drive IC.

Figure 2:
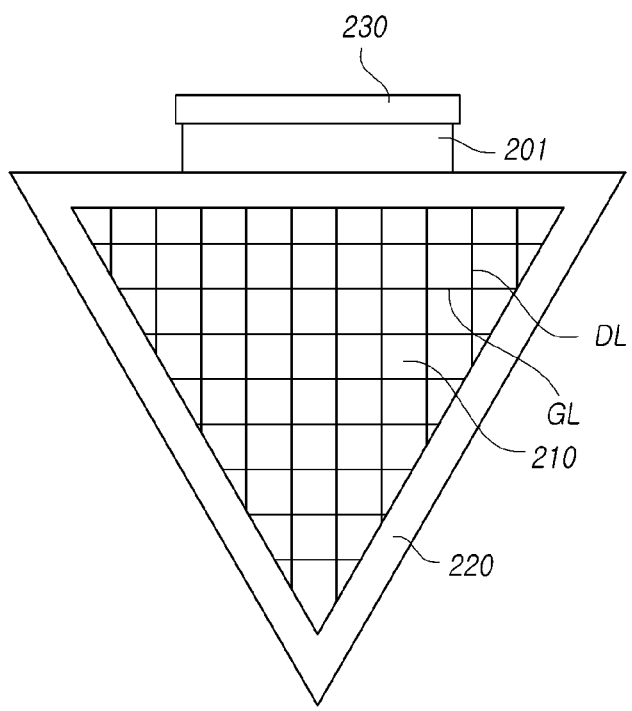
FIG. 2 is a plan view showing another aspect of a display apparatus according to the present disclosure.

The display part 110 of the display apparatus 100 is not limited to the circular shape shown in FIG. 1, and a display part 210 of a display apparatus 200 may have a triangular shape, as shown in FIG. 2. However, the present disclosure is not limited thereto, and the display part may have various shapes, such as a rectangle, an ellipse, and a parallelogram, or a combination thereof.

Figure 3A:
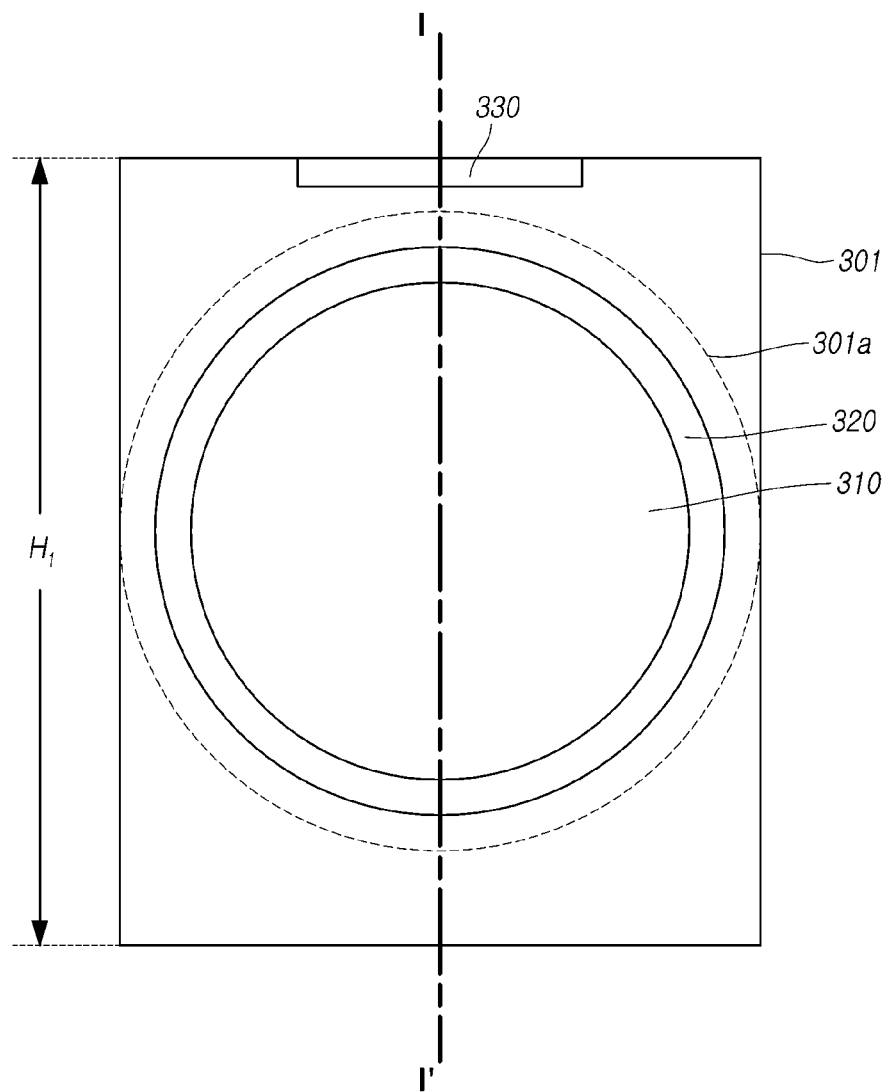
FIG. 3A is a plan view showing an aspect of a substrate according to the present disclosure.
Figure 3B:
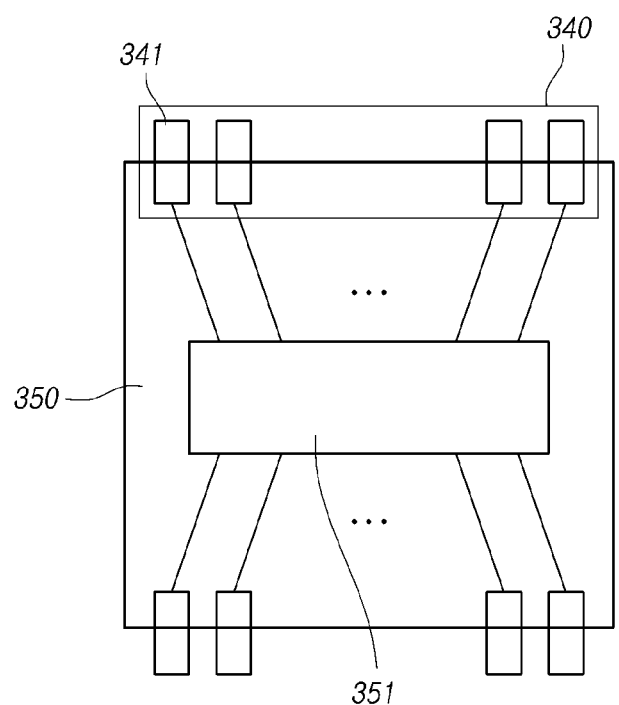
FIG. 3B is a plan view showing an aspect of a chip-on-film (COF) structure according to the present disclosure.

FIG. 3A is a plan view showing an aspect of a substrate, according to the present disclosure, and FIG. 3B is a plan view showing an aspect of a COF, according to the present disclosure. In addition, FIG. 4 is a plan view showing the first pad part shown in FIG. 3A.

Figure 4:
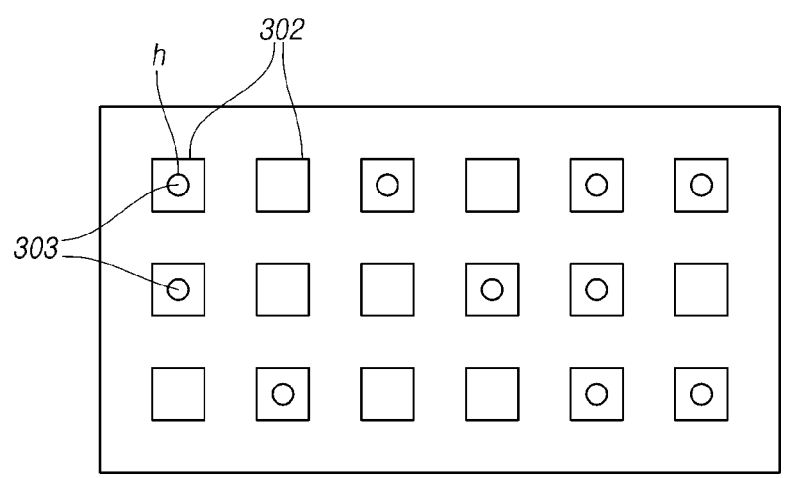
FIG. 4 is a plan view showing a first pad part shown in FIG. 3A.

Referring to FIGS. 3A, 3B and 4, the substrate 301 may have one or more through-holes (h) formed in one area thereof and a conductor 303 inserted into the through-hole (h). In addition, a display part 310 may be disposed in another area on an upper surface of the substrate 301. Although the display part 310 is illustrated as a circular shape, it is not limited thereto, and the display part 310 may have a triangular shape, as shown in FIG. 2. In addition, the display part 310 may have various shapes, such as a rectangle, an ellipse and a parallelogram, or a combination thereof. Further, a data wire, a gate-in-panel (GIP) circuit, a gate control signal wire, and a common power supply line may be disposed at the edge 320 of the display part 310. However, the present disclosure is not limited thereto.

In addition, a first pad part 330 may be disposed in one area on the substrate 301. The first pad part 330 may include a plurality of pads 302 and the respective pads 302 may be connected to the data wire, the gate control signal wire, and the common power supply line, which are disposed at the edge 320 of the display part 310. However, the present disclosure is not limited thereto. At least one of the plurality of pads 302 may be arranged to overlap the through-hole (h) in one area on the upper surface of the substrate 301. To this end, the plurality of pads 302 may be formed in one area on the substrate 301, and a through-hole (h) may be formed in at least one of the plurality of pads, after which a conductor 303 may be inserted into the through-hole (h). However, the present disclosure is not limited thereto. At least one of the plurality of pads 302 may be connected to one end of the conductor 303 inserted into the through-hole (h).

In addition, a chip-on-film (COF) 350 may be disposed on the back surface of the substrate 301. The COF 350 may include a drive IC 351 mounted on a film and a second pad part 340 including a plurality of pads 341 connected to the drive IC 351. The second pad part 340 may be connected to the first pad part 330 through the conductor 303 protruding from the lower surface of the substrate 301. The second pad part 340 may include a plurality of pads, and at least one of the plurality of pads may be in contact with the other end of the conductor 303.

The circular display part 310 and the first pad part 330 may be formed on the substrate 301 having a rectangular shape. A data wire, a GIP circuit, a gate control signal wire, a common power supply line, and the like may be formed on the edge 320 of the display part 310 while the display part 310 is formed on another area on the substrate 301. Further, the substrate 301 may be a plastic substrate. The plastic substrate may be made of a polyimide resin. However, the present disclosure is not limited thereto. In addition, the substrate 301 may include a plurality of stacked plastic substrates.

The substrate 301 may be cut along the dotted line 301a corresponding to the display part 310 and the first pad part 330 in the state in which the display part 310 and the first pad part 330 are formed on the substrate 301. In the case where the display part 310 has a rectangular shape, the display part 310 may be formed to correspond to the substrate 301. In this case, since the substrate is cut along a straight line, the substrate may not be damaged. However, in the case where the display part 310 has various shapes, such as a rectangle, an ellipse and a parallelogram, or a combination thereof, the substrate 301 may be cut along complicated lines. Thus, if the substrate 301 is made of glass, the substrate 301 may be damaged during the cutting. However, in the case where the substrate 301 is made of plastic, even if the substrate 301 is cut along the complicated lines, it is possible to prevent the substrate 301 from being damaged during the cutting. In addition, if the substrate 301 is made of plastic, the substrate 301 may not be damaged when a through-hole (h) is formed in one area thereof. The through-hole (h) may be formed in the substrate 301 through a micro-drilling process. However, the present disclosure is not limited thereto.

In addition, the horizontal and vertical widths of the respective pads formed in the first pad part 330 may be greater than the diameter of the through-hole (h). As a result, when the through-hole is formed in the pad, it is possible to prevent an adjacent pad and the through-hole from overlapping each other. In particular, by making the shapes of the respective pads close to a square, the vertical width of the first pad part 330 can be narrowed.

In addition, in order to form the bezel of the display apparatus to be narrow, the COF 350 may be disposed on the back surface of the substrate 301. When the first pad part 330 of the substrate 301 does not adopt the conductor 303, a part of the substrate 301 is to be bent so as to allow the first pad part 330 to come into contact with the COF 350 disposed on the back surface of the substrate 301. In this case, a bending portion for bending the substrate 301 is required to be disposed between the first pad part 330 and the display part 310 on the substrate. The vertical width (H1) of the substrate may be increased by the area occupied by the bending portion on the substrate 301. However, if the first pad part 330 comes into contact with the COF 350 through the conductor 303 in the lower portion of the substrate 301, the bending portion is not required, whereby the vertical width (H1) of the substrate may be decreased, thereby reducing the size of the substrate used for manufacturing the display apparatus.

Therefore, the vertical width (H1) of the substrate 301 can be shortened because the width of the first pad part 330 is reduced and the area occupied by the bending portion is not required on the substrate 301. Therefore, the size of the substrate 301 can be reduced even if the display part 310 is formed to have an equal size on the substrate 301.

Further, in order to form a bending portion, an additional process of forming a bending portion on the substrate is required, and the substrate may be damaged by the additional process. Since the additional process for forming a bending portion is not necessary in the present disclosure because the bending portion is not required, damage to the substrate can be prevented.

Accordingly, since the substrate 301 can be implemented to have a small size and the manufacturing processes can be simplified while preventing damage to the substrate, it is possible to reduce the cost of manufacturing the display apparatus.

When the display part 310 and the first pad part 330 are formed on the substrate 301, a lighting signal may be transmitted to the display part 310 through the first pad part 330 to perform lighting inspection. In addition, when the COF 350 is connected through the conductor 303 formed on the first pad part 330, the display part 310 can receive a data signal from the drive IC 351 mounted on the COF 350. Further, the COF 350 may transfer a gate control signal, common power, or the like to the display part 310.

FIGS. 5A to 5D are cross-sectional views showing an aspect of a process of manufacturing a display apparatus, according to the present disclosure.

Figure 5A:
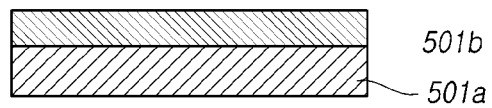
FIGS. 5A to 5D are cross-sectional views showing an aspect of a manufacturing process of a display apparatus according to the present disclosure.

As shown in FIG. 5A, a second plastic substrate 501b is laminated on a first plastic substrate 501a. At this time, the second plastic substrate 501b may be made of a polyimide resin, and the first plastic substrate 501a may be made of a resin, which is harder than that of the second plastic substrate 501b. In addition, the first plastic substrate 501a may be a back plate for supporting the second plastic substrate 501b.

Figure 5B:
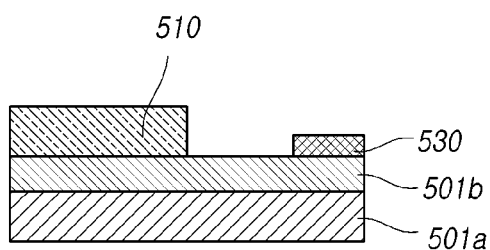

In addition, as shown in FIG. 5B, a display part 510 and a first pad part 530 may be formed on the second plastic substrate 501b. Since the first plastic substrate 501a supports the second plastic substrate 501b at the lower portion of the second plastic substrate 501b, a process for forming the display part 510 and the first pad part 530 on the second plastic substrate 501b can be easily performed. The display part 510 and the first pad part 530 may be connected through lines formed in a process of forming the display part 510 and the first pad part 530. Further, since the first plastic substrate 501a rigidly supports the second plastic substrate 501b because the first plastic substrate 501a is harder than the second plastic substrate 501b, a process of forming the display part 510 and the first pad part 530 can be easily performed on the second plastic substrate 501b.

Figure 5C:
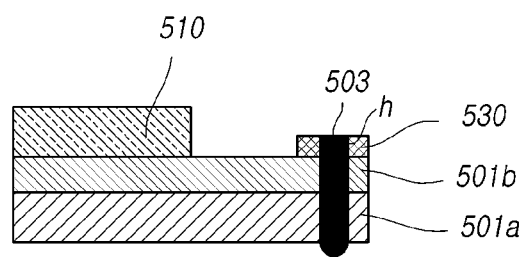

In addition, as shown in FIG. 5C, a through-hole (h) may be formed in an area, in which the first pad part 530 is formed, on the substrate 501, which is made by laminating the first plastic substrate 501a and the second plastic substrate 501b. The through-hole (h) may be formed in at least one of a plurality of pads of the first pad part 530. In addition, a conductor 503 can be inserted into the through-hole (h). The conductor 503 inserted into the through-hole (h) may have one end in contact with the first pad part 530 and the other end protruding from a back surface of the first plastic substrate 501a.

Figure 5D:
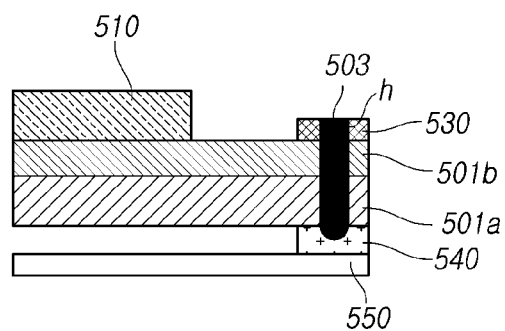

In addition, as shown in FIG. 5D, a COF 550 may be disposed on the back surface of the first plastic substrate 501a, and a second pad part 540 of the COF 550 may come into contact with the other end of the conductor 503. Therefore, the COF 550 may be connected to the first pad part 530 through the conductor 503 while being positioned on the back surface of the first plastic substrate 501a. Thus, by preventing the COF 550 from protruding from the lower portion of the first substrate 501a, the area of the edge portion of the display part 510 can be reduced. Therefore, the bezel of the display apparatus can be made narrow.

Figure 6:
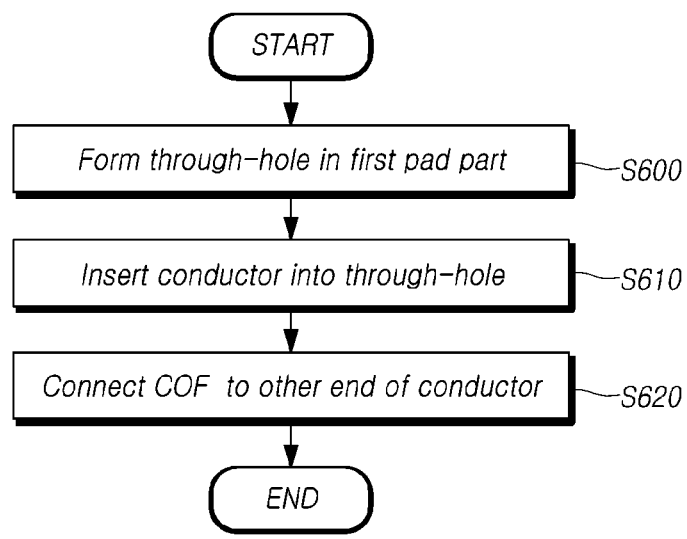
FIG. 6 is a flowchart showing an aspect of a method of manufacturing a display apparatus according to the present disclosure.

FIG. 6 is a flowchart showing an aspect of a method of manufacturing a display apparatus, according to the present disclosure.

Referring to FIG. 6, a method of manufacturing a display apparatus may include forming a through-hole (S600), inserting a conductor into the through-hole (S610), and connecting a COF (chip-on-film) to the conductor (S620).

In forming the through-hole (S600), the through-hole may be formed in a portion where at least one pad is disposed in a first pad part including a plurality of pads, which is formed in one area of the substrate. The substrate may be a plastic substrate. A display part and a first pad part may be formed on the substrate before forming the through-hole, and the through-hole may be formed in one area in which the first pad part is formed on the substrate. A micro-drilling process may be used to form the through-hole in the substrate. However, the present disclosure is not limited thereto. In the case of a plastic substrate, the substrate may not be damaged when the through-hole is formed by means of the micro-drilling process.

Further, after the display part and the first pad part are formed on the substrate, a lighting inspection with respect to the display part may be executed using the first pad part. Then, the substrate, which has been determined to be good through the lighting inspection, may be cut to correspond to the shapes of the display part and the first pad part connected to the display part. If the display part has a circular shape, the substrate may be cut in a circular shape, and if the display part has a triangular shape, the substrate may be cut in a triangular shape. However, the present disclosure is not limited thereto. In addition, it is possible to perform the lighting inspection after cutting the substrate. Further, in the case of a plastic substrate, the substrate may be easily cut.

In addition, in inserting the conductor into the through-hole (S610), the conductor may be inserted into the through-hole such that one end of the conductor is connected to a pad overlapping a portion where the through-hole is formed and the other end of the conductor is exposed on the back surface of the plastic substrate. It is also possible to perform the lighting inspection after forming the through-hole.

In connecting the COF to the conductor (S620), at least one pad of the COF having a second pad part including a plurality of pads may be connected to the other end of the conductor. Accordingly, the second pad part may be connected, through the conductor, to the first pad part formed on the substrate while the COF is positioned on the back surface of the substrate. As a result, the bezel portion of the display apparatus can be formed to be narrow.

Figure 7:
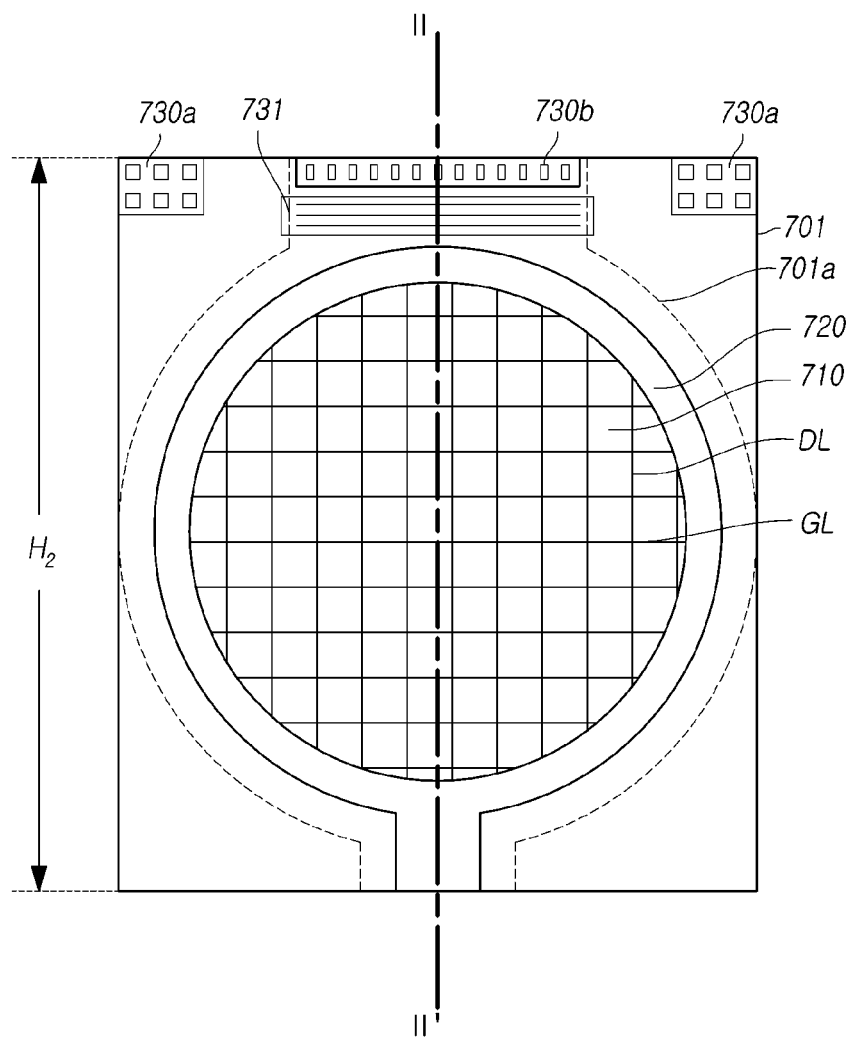
FIG. 7 is a plan view showing an aspect of a display apparatus.

FIG. 7 is a plan view showing an aspect of a substrate according to the present disclosure.

Figure 8:
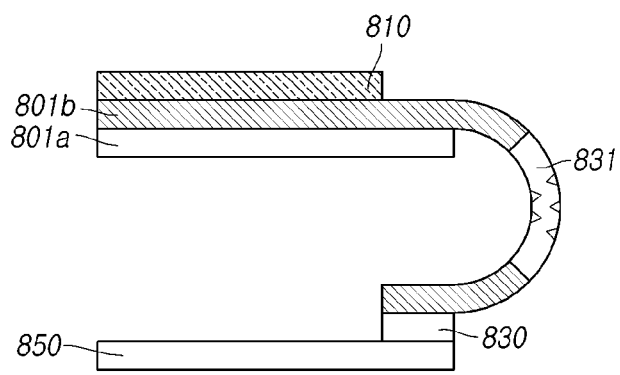
FIG. 8 is a cross-sectional view showing an aspect of the display apparatus shown in FIG. 7.

Referring to FIGS. 7 and 8, a substrate 701 may have a first pad part 730b formed in one area and a display part 710 formed in another area. The substrate 701 may be a plastic substrate. In addition, although the display part 710 is illustrated as a circular shape, it is not limited thereto, and it may have a triangular shape, as shown in FIG. 2. Further, the display part 710 may have various shapes, such as a rectangle, an ellipse, and a parallelogram, or a combination thereof. In addition, a data wire, a GIP (gate-in-panel) circuit, a gate control signal wire, and a common power supply line may be disposed on an edge 720 of the display part 710. However, the present disclosure is not limited thereto. In addition, a bending portion 731 may be formed between the first pad part 730b and the display part 710. The bending portion 731 may be made by forming a specific pattern on the substrate 701 and the bending portion 731 may be bent by means of a specific pattern to allow the substrate 701 to be bent. Further, the bent state of the substrate 701, attributable to the bending portion 731, may facilitate contact between the first pad part 730b and a COF disposed on a back surface of the substrate 701, as shown in FIG. 8.

In addition, a lighting pad 730a for lighting inspection may be disposed in another area on the substrate 701. Since the lighting inspection, which is intended to test whether or not the display part 710 operates normally during the process of manufacturing a display apparatus, is not necessary upon the completion of a display apparatus, the lighting pad 730a may be disposed in a portion of the substrate 701, which will be to be cut away from the substrate 701. When the lighting inspection is completed, the substrate may be cut along the dotted line 701a. The vertical width (H2) of the substrate 701 may be greater than the vertical width (H1) of the substrate 301 shown in FIG. 3 due to the bending portion 731 and a plurality of pads of the first pad part 730b.

FIG. 8 is a cross-sectional view showing an aspect of the display apparatus shown in FIG. 7.

Referring to FIG. 8, a first substrate 801a and a second substrate 801b are laminated, and a display part 810, a bending portion 831, and a first pad part 830 are disposed on the second substrate 801b. The bending portion 831 may be formed in a specific pattern on the second substrate 801b to be bent to allow the first pad part 830 to be connected to a COF 850 disposed in the lower portion of the first substrate 801a. Thus, the COF 850 can be connected while being disposed in the lower portion of the first substrate 801a. The first substrate 801a and the second substrate 801b may be respective plastic substrates. In addition, the first substrate 801a may be a glass substrate and the second substrate 801b may be a plastic substrate. However, the present disclosure is not limited thereto.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the aspects disclosed in the present disclosure are intended to illustrate the scope of the technical idea of the present disclosure, and the scope of the present disclosure is not limited by the aspect. The scope of the present disclosure shall be construed on the basis of the accompanying claims in such a manner that all of the technical ideas included within the scope equivalent to the claims belong to the present disclosure.

What is claimed is:

1. A display apparatus comprising:
   first and second substrates, the second substrate including first, second and third parts, and longer than the first substrate;
   a display part where a data line and a gate line intersect each other, including a plurality of pixels and disposed on the second substrate;
   a first pad part having a plurality of pads, at least one of the plurality of pads connected to the third part of the second substrate;
   a chip-on-film electrically connected to the third part of the second substrate through the first pad part; and
   an edge part surrounding the display part and accommodating a data wire for applying a data signal to the data line, a gate-in-panel (GIP) circuit for applying a gate signal to the gate line, a gate control signal wire for applying a gate control signal to the GIP circuit, and a common power supply line for applying a common power to the plurality of pixels.

2. The display apparatus of claim 1, wherein the first and second substrates include a plastic substrate.

3. The display apparatus of claim 1, wherein the first and second substrates include a glass substrate and a plastic substrate, respectively.

\* \* \* \* \*